(12) United States Patent
Kim et al.

(10) Patent No.: US 12,281,250 B2
(45) Date of Patent: Apr. 22, 2025

(54) HOUSING OF ELECTRONIC DEVICE AND METHOD FOR MANUFACTURING THE SAME

(71) Applicant: Samsung Electronics Co., Ltd., Gyeonggi-do (KR)

(72) Inventors: Hyunsu Kim, Gyeonggi-do (KR); Goeun Kim, Gyeonggi-do (KR); Inkyu Kim, Gyeonggi-do (KR); Hyesun Park, Gyeonggi-do (KR); Heesung Lee, Gyeonggi-do (KR); Youngjun Heo, Gyeonggi-do (KR); Youngsoo Jung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 299 days.

(21) Appl. No.: 17/881,861

(22) Filed: Aug. 5, 2022

(65) Prior Publication Data
US 2023/0106005 A1    Apr. 6, 2023

Related U.S. Application Data

(63) Continuation of application No. PCT/KR2022/010323, filed on Jul. 15, 2022.

(30) Foreign Application Priority Data

Oct. 6, 2021  (KR) .................. 10-2021-0132115
Nov. 23, 2021 (KR) .................. 10-2021-0162219

(51) Int. Cl.
*C09K 13/02*   (2006.01)
*H05K 5/04*    (2006.01)

(52) U.S. Cl.
CPC ............... *C09K 13/02* (2013.01); *H05K 5/04* (2013.01)

(58) Field of Classification Search
CPC ... B24C 3/08; C09K 13/02; C23F 1/32; C23F 1/36; H04M 1/0202; H05K 5/04
See application file for complete search history.

(56) References Cited

U.S. PATENT DOCUMENTS

| | | | |
|---|---|---|---|
| 2011/0056836 A1 | 3/2011 | Tatebe et al. | |
| 2011/0214993 A1* | 9/2011 | Akana ................ | C25D 11/16 205/205 |

(Continued)

FOREIGN PATENT DOCUMENTS

| | | |
|---|---|---|
| CN | 105522683 A | 4/2016 |
| CN | 106358409 A | 1/2017 |

(Continued)

OTHER PUBLICATIONS

International Search Report dated Nov. 2, 2022.

*Primary Examiner* — Humera N. Sheikh
*Assistant Examiner* — Kevin C T Li
(74) *Attorney, Agent, or Firm* — Cha & Reiter, LLC

(57) ABSTRACT

According to an embodiment, a housing of an electronic device comprises: a metal frame, wherein a surface of the metal frame has: a gloss value of 1 gloss unit (Gu) to 10 Gu, and a maximum height of a plurality of irregularities disposed on the surface in a range between 0.1 μm to 2.3 μm, and a maximum depth of valleys between the plurality of irregularities in a range between 0.1 μm to 1.8 μm, and a number of the plurality of irregularities per unit area of 1 cm² in a range between 90 to 200.

6 Claims, 14 Drawing Sheets

(56) References Cited

U.S. PATENT DOCUMENTS

| | | | |
|---|---|---|---|
| 2013/0296203 A1 | 11/2013 | Ay et al. | |
| 2014/0363623 A1* | 12/2014 | Sun | B32B 7/12 |
| | | | 428/209 |
| 2018/0305838 A1* | 10/2018 | Xiong | C25D 11/18 |
| 2018/0309132 A1 | 10/2018 | He et al. | |
| 2019/0237304 A1 | 8/2019 | Chiu et al. | |
| 2020/0017988 A1* | 1/2020 | Yaegashi | C25D 11/04 |
| 2020/0045155 A1* | 2/2020 | Ha | G02B 5/003 |
| 2020/0071845 A1 | 3/2020 | Zhang et al. | |
| 2020/0103937 A1 | 4/2020 | Curran et al. | |

FOREIGN PATENT DOCUMENTS

| | | |
|---|---|---|
| EP | 3 399 851 A1 | 7/2018 |
| JP | 2005-42197 A | 2/2005 |
| JP | 2010-84198 A | 4/2010 |
| KR | 10-2012-0057645 A | 6/2012 |
| KR | 10-2014-0006220 A | 1/2014 |
| KR | 10-2014-0014044 A | 2/2014 |
| KR | 10-2018-0068545 A | 6/2018 |
| KR | 10-2020-0015046 A | 2/2020 |
| KR | 10-2020-0035861 A | 4/2020 |

* cited by examiner (a)

(b)

(a)

(b)

(a)

(b)

HOUSING OF ELECTRONIC DEVICE AND METHOD FOR MANUFACTURING THE SAME

CROSS-REFERENCE TO RELATED APPLICATIONS

This application is a continuation of International Application No. PCT/KR2022/010323 designating the United States, filed on Jul. 15, 2022, in the Korean Intellectual Property Receiving Office and claiming priority to Korean Patent Application No. 10-2021-0132115, filed Oct. 6, 2021, in the Korean Intellectual Property Office, and to Korean Patent Application No. 10-2021-0162219, filed Nov. 23, 2021, in the Korean Intellectual Property Office the disclosures of all of which are incorporated by reference herein in their entireties.

BACKGROUND

Field

Embodiments of the disclosure relate to a housing of an electronic device and a method for manufacturing the same.

Description of Related Art

Advancing information communication technology and semiconductor technology accelerate the spread and use of various electronic devices. In particular, recent electronic devices are being developed to carry out communication while carried on. Further, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling and e-wallet function. Such electronic devices become compact enough for users to carry in a convenient way.

There is an ongoing research effort to provide a better aesthetic look to an electronic device while protecting various circuit devices in the electronic device by produce the housing of the electronic device using metal. Aluminum can be used as an exterior material for various electronic device products, such as portable electronic devices, PCs, and TVs. An aluminum exterior material may be implemented with texture for surface protection and various appearances by being subjected to pre-treatment, followed by surface treatment, such as painting, plating, deposition, and anodizing.

Processes for implementing surface texture can include blasting that propels various media (sand, ceramic, aluminum, etc.) to the metal surface at a constant pressure, physical polishing (wheel polishing) that processes the metal surface with an abrasive stone or abrasive cloth, and hairline patterning that processes the metal surface with a metal brush or sandpaper in a certain direction.

According to such processing, a glossy or rough surface may be obtained or patterned texture may be implemented.

Anodizing a surface treatment can form a high-adhesion oxide coating on the base metal with oxygen generated by conducting electricity through the anode. The anodized metal surface can have a vivid metal texture and give a better aesthetic feel along with superior corrosion resistance and abrasion resistance.

With anodizing, however, high-glossy or semi-glossy and rough metal texture may be implemented, but a soft and matte exterior, such as of a microfiber cloth, is not.

The disclosure provides a housing of an electronic device, which has soft and matte surface texture, and a method for manufacturing the same.

The disclosure is not limited to the foregoing embodiments but various modifications or changes may rather be made thereto without departing from the spirit and scope of the disclosure.

SUMMARY

According to an embodiment, a method for manufacturing a housing of an electronic device, the method comprises: forming curves on a surface of a metal frame; and immersing the metal frame in an alkali etching solution including a phosphate.

According to an embodiment, a housing of an electronic device comprises: a metal frame, wherein a surface of the metal frame has: a gloss value of 1 gloss unit (Gu) to 10 Gu, and a maximum height of a plurality of irregularities disposed on the surface in a range between 0.1 µm to 2.3 µm, and a maximum depth of valleys between the plurality of irregularities in a range between 0.1 µm to 1.8 µm, and a number of the plurality of irregularities per unit area of 1 $cm^2$ in a range between 90 to 200.

DETAILED DESCRIPTION

According to certain embodiments of the disclosure, it is possible to implement a metal frame having a surface with soft texture, like that of a microfiber cloth, and a matte particle texturing feel.

Further, according to certain embodiments of the disclosure, both the outer and inner surfaces of the metal frame may have soft texture, like that of a microfiber cloth, and a matte particle texturing feel.

Further, certain embodiments of the disclosure are applicable to a group of products that use metal, as well as the housing of the electronic device.

Figure 1:
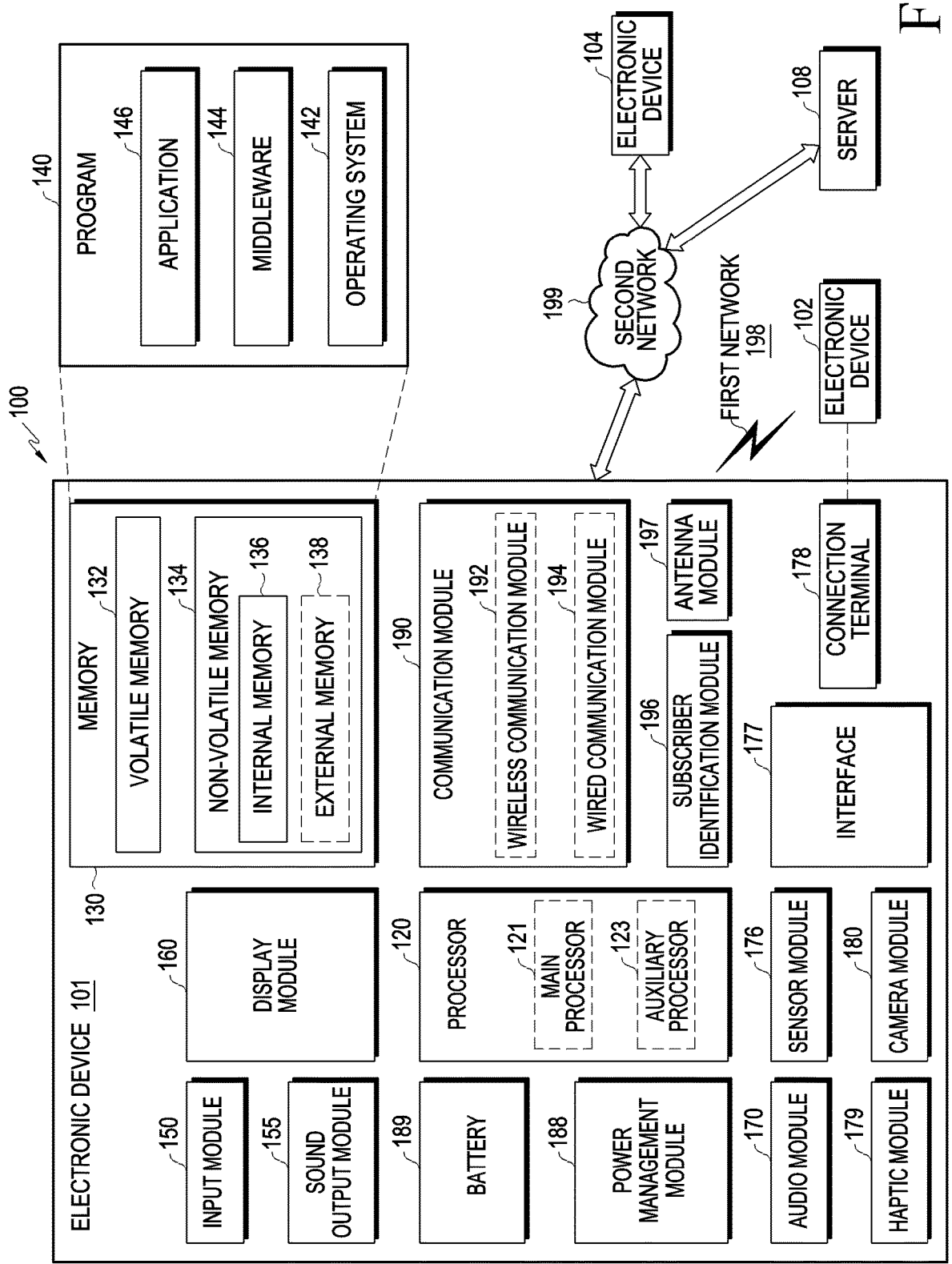
FIG. 1 is a view illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101.

The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device 100 can include a housing to protect and hold together electronic components that implement the foregoing functions and modules. For example, the electronic device 100 can be thin and rectangular, with the display module 160 disposed on one surface.

Figure 2:
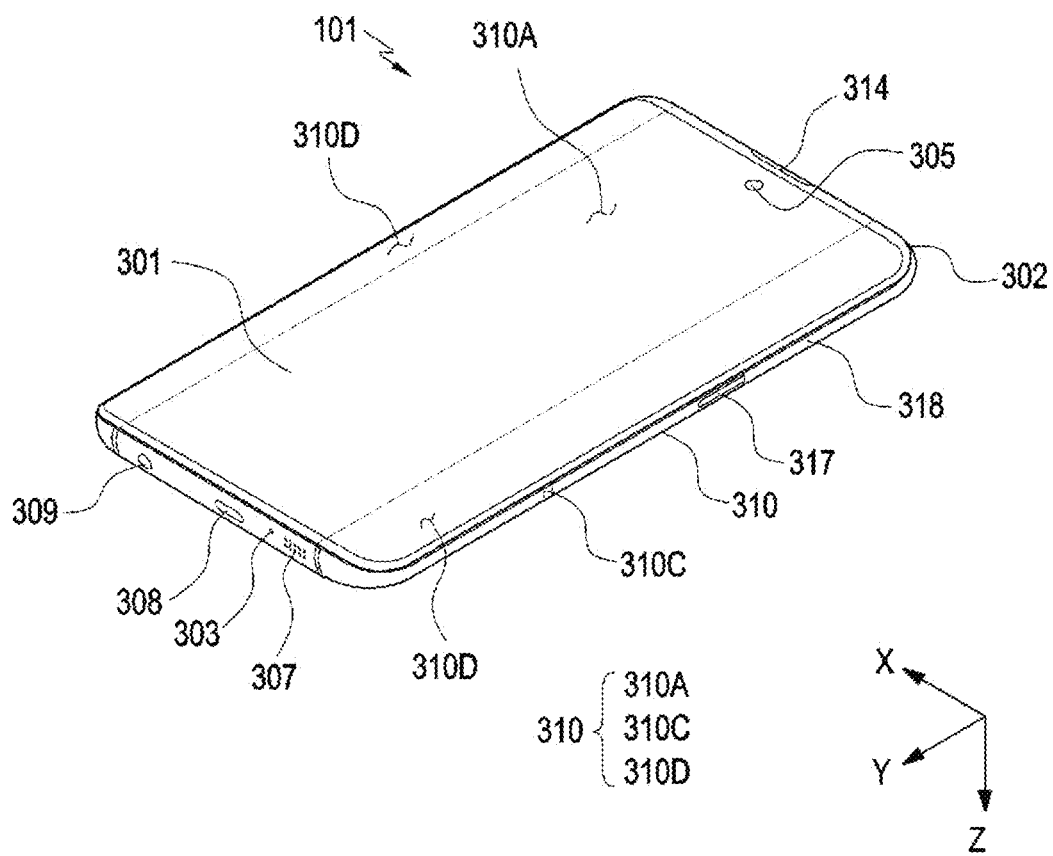
FIG. 2 is a front perspective view illustrating an electronic device according to various embodiments of the disclosure.

FIG. 2 is a front perspective view illustrating an electronic device according to various embodiments of the disclosure.

Figure 3:
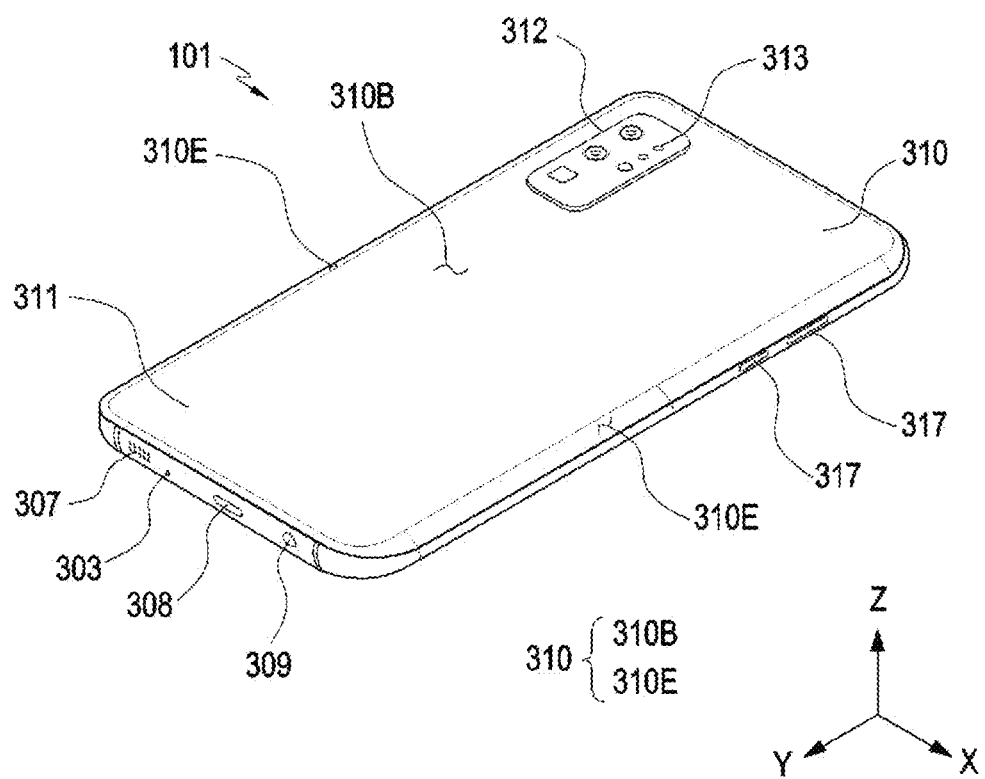
FIG. 3 is a rear perspective view illustrating an electronic device according to various embodiments of the disclosure.

FIG. 3 is a rear perspective view illustrating an electronic device according to various embodiments of the disclosure.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A, the rear surface 310B, and the side surface 310C of FIG. 2. At least part of the front surface 310A may have a substantially transparent front plate 302 (e.g., a glass plate or polymer plate including various coating layers).

The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge areas 310D, which seamlessly and bendingly extend from the first surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310 (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., the audio module 170 of FIG. 1), a sensor module (e.g., the sensor module of FIG. 1). 176), camera modules 305, 312, and 313 (e.g., the camera module 180 of FIG. 1), a key input device 317 (e.g., the input module 150 of FIG. 1), and connector holes 308 and 309 (e.g., the connection terminal 178 of FIG. 1). According to an embodiment, the electronic device 101 may exclude at least one (e.g., the connector hole 309) of the components or may add other components.

According to an embodiment, the display 301 may be visually revealed through, e.g., a majority portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to an embodiment, a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to another embodiment (not shown), at least one or more of the audio module 314, sensor module (not shown), camera module 305, fingerprint sensor (not shown), and light emitting device (not shown) may be included on the rear surface of the screen display area of the display 301.

According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen.

According to an embodiment, at least part of the key input device 317 may be disposed in the first edge areas 310D and/or the second edge areas 310E.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (not shown) (e.g., a proximity sensor) and/or a second sensor module (not shown) (e.g., a fingerprint sensor) disposed on the front surface 310A of the housing 310 and/or a third sensor module (not shown) (e.g., an HRM sensor) and/or a fourth sensor module (not shown) (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not shown). The sensor module (not shown) is not limited to the above-described structure. Depending on the structure of the electronic device 101, various design changes may be made—e.g., only some of the sensor modules may be mounted, or a new sensor module may be added.

According to an embodiment, the camera modules 305, 312, and 313 may include a first camera module 305 disposed on the first surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module (not shown) disposed on the rear surface 310B of the housing 310.

According to an embodiment, the light emitting device (not shown) may be disposed on, e.g., the front surface 310A of the housing 310. The light emitting device (not shown) may provide, e.g., information about the state of the electronic device 101 in the form of light. According to another embodiment, the light emitting device (not shown) may provide a light source that interacts with, e.g., the front camera module 305. The light emitting device (not shown) may include, e.g., a light emitting diode (LED), an infrared (IR) LED, and/or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device. The connector holes 308 and 309 are not limited to the above-described structure. Depending on the structure of the electronic device 101, various design changes may be made, such as mounting only some of the connector holes or adding a new connector hole.

According to an embodiment, the camera module 305 and/or the sensor module (not shown) may be disposed to contact the external environment through a designated area of the display 301 and the front plate 302 from the internal space of the electronic device 101. For example, the designated area may be an area in which pixels are not disposed in the display 301. As another example, the designated area may be an area in which pixels are disposed in the display 301. When viewed from above the display 301, at least a portion of the designated area may overlap the camera module 305 and/or the sensor module. As another example, some sensor modules may be arranged to perform their functions without being visually exposed through the front plate 302 from the internal space of the electronic device.

The electronic device 101 disclosed in FIGS. 2 and 3 has a bar-type or plate-type appearance but the disclosure is not limited thereto. For example, the illustrated electronic device may be part of a rollable electronic device or a foldable electronic device. "Rollable electronic device" may mean an electronic device at least a portion of which may be wound or rolled or received in a housing 310 as the display 301 may be bent and deformed. As the display is stretched out or is exposed to the outside in a larger area according to the user's need, the rollable electronic device may use an expanded second display area. "Foldable electronic device" may mean an electronic device that may be folded in directions to face two different areas of the display or in directions opposite to each other. In general, in the portable state, the foldable electronic device may be folded so that the two different areas of the display face each other and, in an actual use state, the user may unfold the display so that the two different areas form a substantially flat shape. In some embodiments, according to certain embodiments of the disclosure, the electronic device 101 may be interpreted as including various electronic devices, such as a laptop computer or a home appliance, as well as a portable electronic device, such as a smart phone.

Aluminum can be used as an exterior material for various electronic devices. An aluminum exterior material may be implemented with texture for surface protection and various appearances by being subjected to pre-treatment, followed by surface treatment, such as painting, plating, deposition, and anodizing.

Processes for implementing surface texture can include blasting that propels various media (sand, ceramic, aluminum, etc.) to the metal surface at a constant pressure, physical polishing (wheel polishing) that processes the metal surface with an abrasive stone or abrasive cloth, and hairline patterning that processes the metal surface with a metal brush or sandpaper in a certain direction.

According to such processing, a glossy or rough surface may be obtained or patterned texture may be implemented.

Anodizing a surface treatment can form a high-adhesion oxide coating on the base metal with oxygen generated by conducting electricity through the anode. The anodized metal surface can have a vivid metal texture and give a better aesthetic feel along with superior corrosion resistance and abrasion resistance.

Figure 4:
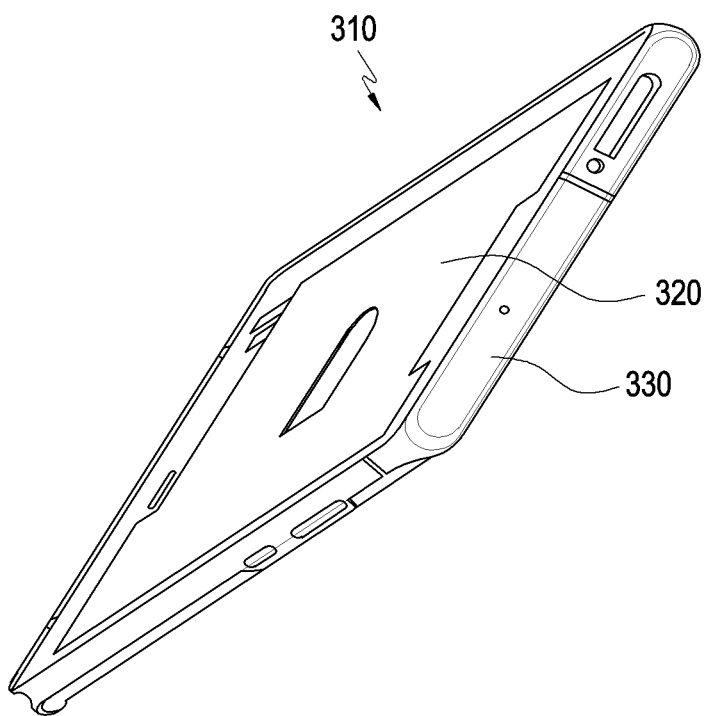
FIG. 4 is a view illustrating a housing of an electronic device according to various embodiments of the disclosure.

FIG. 4 is a view illustrating a housing 310 of an electronic device (e.g., the electronic device 101 of FIG. 1) according to various embodiments of the disclosure.

According to various embodiments an electronic device (e.g., the electronic device 101 of FIG. 1) may include a housing 310 at least a portion of which includes an electrically conductive material, or a metal, such as aluminum. The housing 310 may be formed of a metallic (e.g., aluminum) frame, and may include, e.g., an outer surface 330 (or an outer frame). The outer surface 330 is a portion exposed to the outside when combined with the electronic device. The housing may also include an inner surface 320 (or an inner frame) facing in the direction opposite to the outer surface 330.

The housing 310 illustrated in FIG. 4 may have substantially the same configuration as the housing 310 described above in connection with FIGS. 2 and 3. For example, it is shown that the front plate portion is omitted from the housing described above in connection with FIGS. 2 and 3, and the side bezel structure and the rear plate are coupled to each other. The electronic device may have various exterior looks with different shapes or sizes (e.g., length, height, or area) of the housing. Hereinafter, what overlaps those described above in connection with FIGS. 2 and 3 may be omitted.

The housing 310 may be formed at least partially to have an electrically conductive material and/or aluminum to add an aesthetic feeling. The electrically conductive material may also be used as an antenna. Since at least a portion of the housing 310 is made of metal, the electronic device may rigid.

According to various embodiments, the side member and/or rear plate included in the housing 310 is illustrated as a portion of the electronic device. However, the foregoing is not limiting, and it may be implemented as a structure detachable from the housing 310 of the electronic device. For example, the side member and/or the rear plate may be coupled with the electronic device to protect external impact or foreign bodies.

According to various embodiments, the housing 310 may be referred to by various terms, such as 'cover', 'case', 'envelope', 'exterior case', 'accessory case' or 'enclosure'. According to various embodiments, the side member and/or rear plate included in the housing 310 is not limited to the embodiments mentioned herein but may be formed in other various shapes depending on the shape of the electronic device.

According to an embodiment, the surface of the metal frame of the housing 310 may have soft texture and a matte particle texturing feel.

According to an embodiment, although this disclosure presents a method for manufacturing a frame of a portable electronic device, the disclosure is also applicable to products that use metal as their exterior material without limited thereto.

According to an embodiment, the inner surface 320 and outer surface 330 of the housing 310 may be formed to have the same surface texture and surface particle texturing feel.

According to an embodiment, an alkali etching solution including phosphate may be used to implement a surface texture and particle texturing feel on the housing 310. A method for manufacturing a housing 310 using an alkali etching solution including phosphate is described below in detail. The method includes preparing the exterior metal material, polishing, roughening and glossing the surface, implementing texture by phosphate and alkali etching, anodizing, and treating the surface to provide protection.

Figure 5:
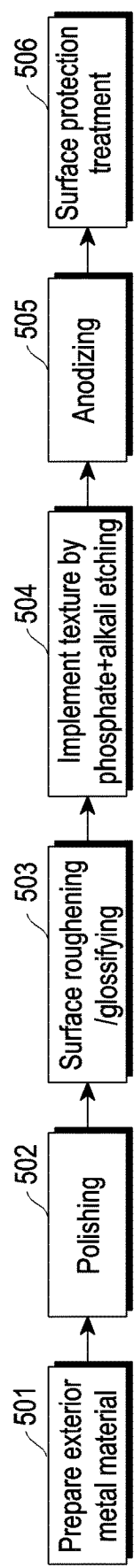
FIG. 5 is a view illustrating a method for manufacturing a housing of an electronic device according to an embodiment of the disclosure.

FIG. 5 is a view illustrating a method for manufacturing a housing of an electronic device according to an embodiment of the disclosure.

According to an embodiment, referring to FIG. 5, in operation 501, a method for manufacturing a housing of an electronic device may prepare an exterior metal material.

For example, a raw material of the housing including the metal frame may be prepared, such as, an aluminum plate material. The raw material, e.g., aluminum plate material can be used as an exterior or interior material of the electronic device. The aluminum plate material may include, e.g., a 2xxx series alloy, a 6xxx series alloy, and/or a high strength 7xxx series alloy, except for pure aluminum. For example, the aluminum alloy may include aluminum, as its main component, and copper, magnesium, manganese, silicon, tin, or zinc, as a main alloying element.

Next, the raw material of the housing including the metal frame may cut and bonded. The housing 310 may be cut into a desired shape. After cutting, the member is subjected to bonding. Bonding may mean any chemical or physical processing that is capable of bonding metal and the molten resin injected in a injection process. It shall be understood that that the structure resultant from injection molding, is different from the structure that may be achieved by assembling pieces without molding. For example, the curves of the mold are adopted in a manner that cannot be achieved by grounding and sanding.

Without bonding, the metal may be less bondable to the injected resin and be thus broken or separated. Thus, bonding may be required to be performed before the injection process. The molten resin may be injected to the metal frame through the injection process, so that the resin and the metal may be bonded to each other.

According to an embodiment, in operation 502, the method for manufacturing a housing of an electronic device may perform polishing on the surface of the metal frame.

According to an embodiment, after completion of the injection process, machining may be used on material to process the material a final shape. Machining here may include polishing (wet or dry polishing) and diamond cutting (dia-cut) that may involve the final exterior shape of the exterior material, as well as simple cutting.

According to an embodiment, polishing is performed to implement high gloss on the surface of the metal frame of the electronic device. Such polishing may include physical polishing (dry/wet polishing) and/or electropolishing. For polishing, physical polishing may be performed, followed by electropolishing. As another example, physical polishing may be performed after electropolishing. As another example, either physical polishing or electropolishing may be selected and performed.

According to an embodiment, physical polishing may be performed by bringing a rotating polisher, such as a rotary polisher, in contact with the surface of the metal frame. For physical polishing, either wet polishing, which is performed with the surface of the metal frame wet, or dry polishing, which is performed with the surface of the metal frame dry, may be selected and performed. Electropolishing may planarize and/or glossify the surface of the metal frame using anodic dissolution.

According to an embodiment, in operation 503, the method for manufacturing a housing of an electronic device may include surface roughening/glossifying after polishing (e.g., physical polishing and/or electropolishing). According to an embodiment, surface roughening/glossifying may be performed after physical polishing or electropolishing is done. For example, that the surface is roughened/glossified may mean that irregularities are formed on the surface.

According to an embodiment, surface roughening/glossifying may be performed after physical polishing and electropolishing are sequentially done or without polishing.

According to an embodiment, surface roughening/glossifying may be performed to implement irregularities (e.g., roughness) on the surface of the metal frame to be applied to the electronic device and may include a method of physically applying force, e.g., sand blasting. According to an embodiment, the surface roughening/glossifying may include all processes involved in the design appearance, such as barrel polishing and hairline patterning.

Operation 503 can include propelling particles towards the metal frame. The foregoing causes curves to form on the metal frame, i.e., or roughening the surface.

According to an embodiment, other processes than those described above may be added or some of the above-described processes may be omitted.

For example, foreign bodies, such as cutting oil that is generated in the above-described machining and polish may be removed through degreasing. Degreasing may remove foreign bodies existing on the surface of the metal frame as well as the oxide film of the metal oxidized in the air. For example, types of degreasing may include an organic solvent method using benzene and/or ethylene, a surfactant method using a neutral detergent and/or synthetic detergent, and an acid degreasing method using sulfuric acid and/or nitric acid.

According to an embodiment, in operation 504, the method for manufacturing a housing of an electronic device may implement texture on the surface of the metal frame using an alkali etching solution including phosphate (e.g., a chelating agent). For example, it is possible to implement soft and matte texture on the surface of the metal frame by immersing the roughened metal frame in the alkali etching solution including phosphate.

The phosphate included in the alkali etching solution acts to sequester metal ions. When the surface of the metal frame is etched, the phosphate prevents the precipitation and re-adhesion of impurities, leading to a uniform reaction on the surface and hence forming a soft particle texturing feel. According to an embodiment, the reaction on the surface of the metal frame, which is performed during immersion of the roughened metal frame in the alkali etching solution including phosphate is described below with reference to FIGS. 6A and 6B.

According to an embodiment, the concentration of the alkali etching solution may be 1% to 50%. If the concentration of the alkali etching solution is less than 1%, the etching effect is low, and if it is 50% or more, the etching may not be controlled even when the etching solution contains phosphate, resulting in rough texture.

According to an embodiment, the alkaline etching solution may include at least one of sodium hydroxide (NaOH), potassium hydroxide (KOH), lithium hydroxide (LiOH), sodium carbonate ($Na_2CO_3$) or sodium phosphate ($Na_3PO_4$).

According to an embodiment, as the alkaline etching solution, one alkaline etching solution may be used alone, a mixture of two or more alkaline etching solutions may be used, two or more alkaline etching solutions may be used sequentially, or an alkaline etching solution which adds other compounds may be used.

According to an embodiment, the concentration of the phosphate may be 1% to 50%. If the concentration of phosphate is less than 1%, the effect of preventing precipitation and re-adhesion of impurities may be insignificant and, if the concentration is 50% or more, the reaction between the metal frame surface and the alkali etching solution may be suppressed, so that the etching is not properly performed and a desired texture may not be obtained.

Preferably, the concentration of phosphate may be 1% to 30%. When the concentration of phosphate is within 30%, it is possible to facilitate control of the etching reaction to obtain a desired texture. For example, when the concentration of phosphate is within 30%, it is possible to obtain a metal frame having a surface with a desired texture by immersion at a temperature in a range of 30° C. (86° F.) to 80° C. (176° F.) for about 15 minutes.

According to an embodiment, the phosphate may include at least one of sodium tripolyphosphate ($Na_5P_3O_{10}$), potassium triphosphate ($K_3PO_4$), sodium pyrophosphate ($Na_4P_2O_7 \cdot nH_2O$) or potassium polyphosphate ($K_5P_3O_{10}$).

According to an embodiment, immersion of the roughened metal frame in the alkaline etching solution including phosphate may be performed at 30 É to 80 É.

According to an embodiment, immersion of the roughened metal frame in the alkaline etching solution including phosphate may be performed for 10 seconds to 20 minutes.

According to an embodiment, in operation 505, the method for manufacturing a housing of an electronic device may include anodizing. Anodizing may include cleaning, anodic oxide coating formation (or anodizing), and/or coloring (or dyeing).

According to an embodiment, cleaning may include degreasing, chemical polishing, and desmutting. Degreasing may be performed to clear foreign bodies on the metal surface. In this case, degreasing may selectively adopt an acidic or neutral degreasing solution depending on the processing environment and target material. Chemical polishing may be performed to planarize the uneven surface of the material to thereby reduce diffuse reflection and enhance surface gloss. Chemical polishing may planarize the surface irregularities with an acid solution, such as phosphoric acid, sulfuric acid, nitric acid, and the like. Desmutting may be performed to remove residues (e.g., smut and other foreign bodies) on the surface of the material generated from degreasing and chemical polishing.

An anodic oxide coating may be formed by anodizing the surface of the metallic exterior material. Anodic oxide coating formation may be performed by preparing a device for containing an electrolyte including at least one or all of electrolytes containing sulfuric acid, oxalic acid, phosphoric acid, chromic acid, organic acids (citric acid, acetic acid, propionic acid, tartaric acid) or boric acid, putting the housing including the metal frame in the electrolyte, and providing a predetermined voltage and temperature. Anodic oxide coating formation may cause a reaction with oxygen while applying voltage to the metallic member, forming a high-density coating. For example, the voltage used may range from about 5V to 40V, and the processing time may be about 10 minutes to about 2 hours. The processing temperature may range from about 5° C. to about 30° C.

After anodizing, coloring may be performed. Coloring may add a color to the anodized oxide coating. For example, types of coloring processes may include immersion, electrocoloring, or oil-based coloring. Immersion may immerse the product in a dye-dissolved solution. The foregoing would impart a color with the spread and adsorbed dye, and electrocoloring is a method that implements a color by performing electrolysis on the metal salt electrolyte using a rectifier and then applying current thereto. Oil-based coloring may be a coloring method that photosensitizes and dries the oxide coating and then applies an oil dye to the oxide coating with a brush. Types of dyes for immersion may include organic or inorganic dyes. As the dyes for immersion are dissolved mainly in water, immersion may also be called water-based coloring.

According to an embodiment, in operation 506, the method for manufacturing a housing of an electronic device may perform surface protection treatment which is post-anodizing treatment. For example, the surface protection treatment may include sealing and a post-sealing process. Sealing may include processing including a metal salt and non-metal salt processing based on an organic material. Sealing may include hydro-thermal sealing using water and steam. The post-sealing process may include elution for removing the metal salt or hot water washing for washing out foreign bodies. Such post-treatment processes may be performed to secure exterior stability and reliability of the anodized and colored material. Typically, the colored housing may have a single color.

According to an embodiment, after having undergone immersion in the alkali etching solution including phosphate, the surface of the metal frame may have a gloss value of 1 Gu to 10 Gu (gloss unit). According to an embodiment, a result of gloss measurement is described below with reference to FIGS. 7 and 8.

According to an embodiment, the maximum height may be 0.1 μm to 2.3 μm for the plurality of irregularities formed on the surface of the metal frame that has undergone immersion in the alkali etching solution including phosphate. The maximum depth may be 0.1 μm to 1.8 μm of the valley between the plurality of irregularities. According to an embodiment, a result of measuring the height of the irregularities is described below with reference to FIGS. 9 and 10.

According to an embodiment, on the surface of the metal frame after immersion in the alkali etching solution including phosphate, the number of irregularities per unit area of 1 $cm^2$ (0.15 sq in) may be 90 to 200. According to an embodiment, the number of irregularities per unit area is described below with reference to FIGS. 11A and 11B. According to an embodiment, the average size of irregularities is described below with reference to FIG. 12.

According to an embodiment, on the surface of the metal frame after immersion in the alkali etching solution including phosphate, the number of peaks per unit area of 1 $mm^2$ may be 37,000 to 50,000, and the root mean square for the gradients of the peaks may be 2,500 to 4,000. According to an embodiment, the number of peaks and the gradients of the peaks are described below with reference to FIG. 13.

According to an embodiment, after having undergone immersion in the alkali etching solution including phosphate, the outer surface and the inner surface may have the same texture.

Figure 6A:
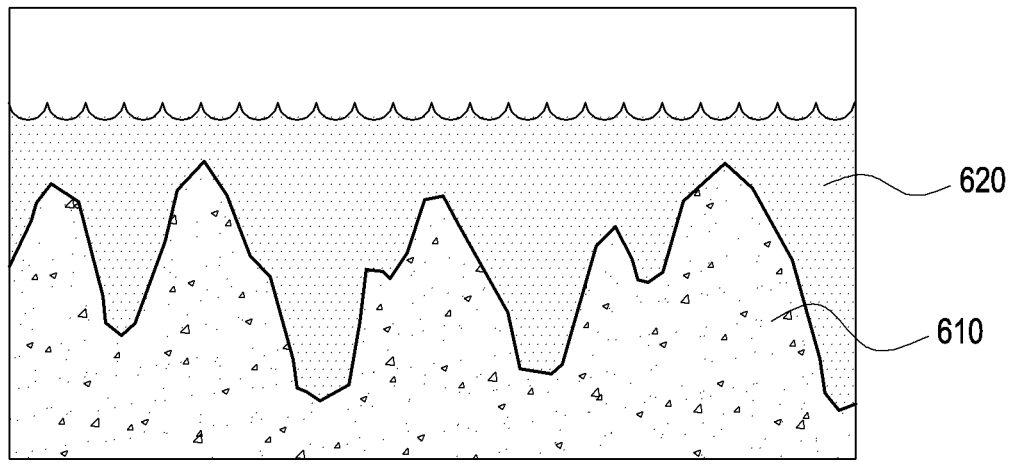
FIG. 6A is a view illustrating a process of immersing a blasted metal frame in an alkali etching solution including phosphate according to an embodiment of the disclosure.

FIG. 6A is a view illustrating a process of immersing a blasted metal frame in an alkali etching solution including phosphate according to an embodiment of the disclosure.

According to an embodiment, referring to FIG. 6A, the method for manufacturing a housing of an electronic device may include immersing the metal frame 610, which has a surface formed with irregularities by blasting, in the alkali etching solution 620 including phosphate.

According to an embodiment, etching may be performed on the surface of the metal frame formed with irregularities by the alkali etching solution. According to an embodiment, the phosphate included in the alkali etching solution may sequester metal ions, preventing precipitation and re-adhesion of impurities. Thus, a uniform reaction may be induced on the surface of the metal frame, forming a soft particle texturing feel as shown in FIG. 6B.

Figure 6B:
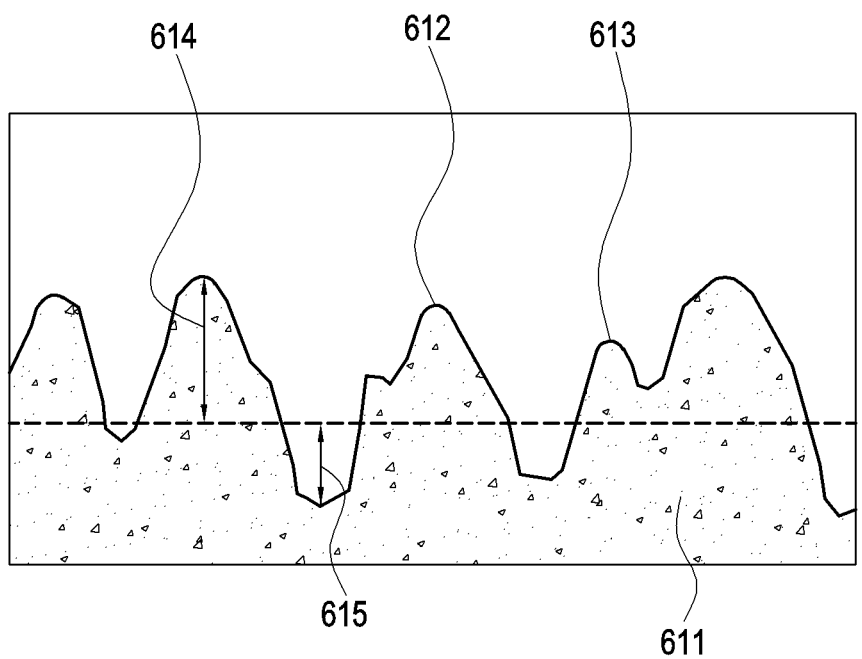
FIG. 6B is a view illustrating a view illustrating a metal frame etched using an alkali etching solution including phosphate according to an embodiment of the disclosure.

FIG. 6B is a view illustrating a view illustrating a metal frame etched using an alkali etching solution including phosphate according to an embodiment of the disclosure.

According to an embodiment, referring to FIG. 6B, the etched surface of the metal frame 611 may include irregularities 612 and 613 with smoothed edges due to the uniform surface etching reaction.

According to an embodiment, the maximum height 614 of the irregularities of the etched metal frame 611 may be in the range of 0.1 µm to 2.3 µm. For example, the maximum height 614 of the irregularities may be 2.115 µm, when measured from the average height. According to an embodiment, the maximum height 614 of the irregularities may mean the largest value among the heights measured from the respective centers of a predetermined number of (e.g., 10) irregularities on the surface of the metal frame 611 after etching.

According to an embodiment, the maximum depth 615 of the valleys of the etched metal frame 611 may be in the range 0.1 µm to 1.8 µm. For example, the maximum depth 615 of the valleys may be 1.515 µm measured from the average height. According to an embodiment, the maximum depth 615 of the valleys may mean the largest value among the depths measured from the respective centers of a predetermined number of (e.g., 10) irregularities on the surface of the metal frame 611 after etching.

As described above, as the edges of the irregularities are smoothed, and the maximum height of the irregularities and the maximum depth of the valleys decrease, the surface of the metal frame may have soft texture, like that of a microfiber cloth, and a matte particle texturing feel.

Figure 7:
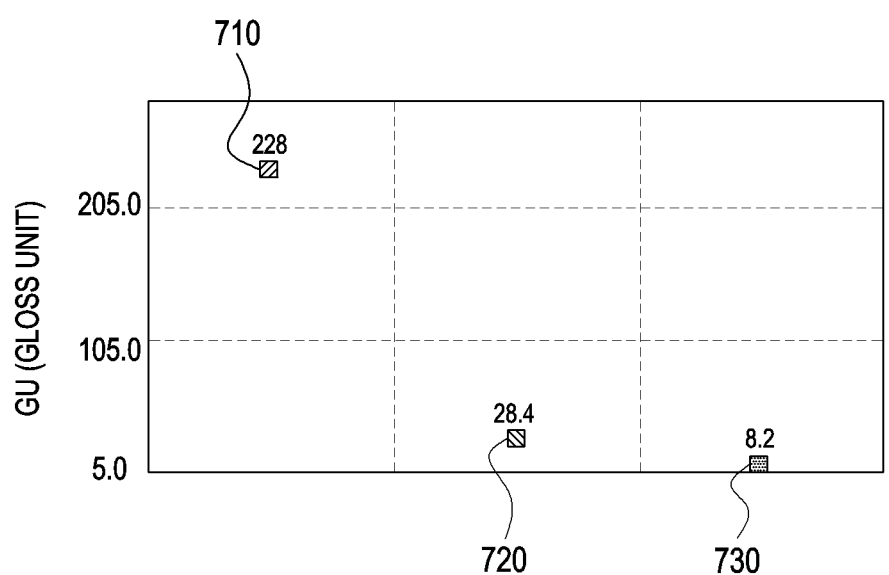
FIG. 7 is a view illustrating a result of measuring the surface gloss of a metal frame according to a surface treatment scheme.

FIG. 7 is a view illustrating a result of measuring the surface gloss of a metal frame according to a surface treatment scheme. According to an embodiment, FIG. 7 shows the results of measuring surface gloss for a metal frame with a high-gloss surface, a sanded metal frame, and a metal frame etched with an alkali etching solution including phosphate according to the disclosure.

According to an embodiment, since the gloss value differs depending on the color of the surface, all of the three metal frames were measured, as uncolored (silver) metal frames, under the same condition, measurement were performed on the same points of the metal frames five times, and the average value was calculated.

According to an embodiment, referring to FIG. 7, it may be identified that the result 710 of gloss measurement on the high-gloss metal frame is 228 Gu (gloss unit), the result 720 of gloss measurement on the sanded metal frame is 28.4 Gu, and the result 730 of gloss measurement on the metal frame according to the disclosure is 8.2 Gu. According to an embodiment, Gu is the unit of the gloss rate of the surface by light reflection, and as its value increases, the degree of gloss may increase.

Such difference in gloss may be identified with the naked eye, and it may be identified that the metal frame according to the disclosure has a matte particle texturing feel.

Figure 8:
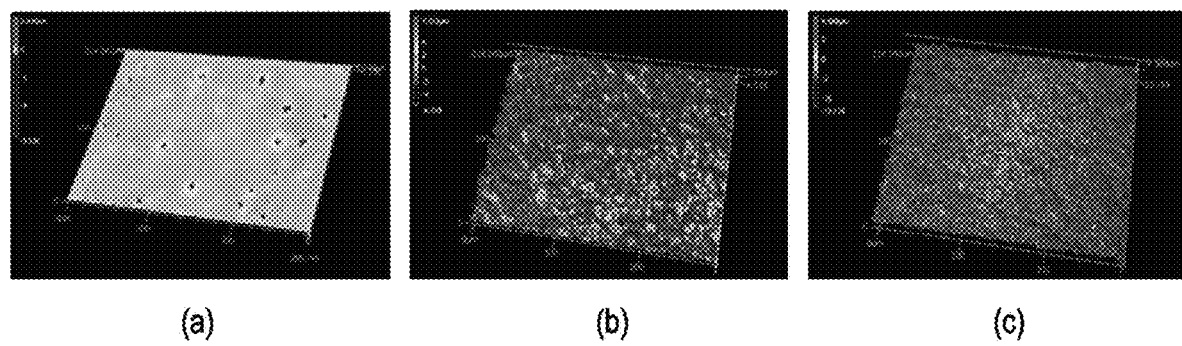
FIG. 8 is a view illustrating a result of observing the surface of a metal frame according to a surface treatment scheme according to the disclosure.

As shown in FIG. 7, the reason why the metal frame according to the disclosure has a low-gloss, matte texture may be identified through the shape of the surface as shown in FIG. 8.

FIG. 8 is a view illustrating a result of observing the surface of a metal frame according to a surface treatment scheme according to the disclosure.

According to a comparative example, referring to FIG. 8(a), it may be identified that the high-gloss metal frame has a flat surface.

According to a comparative example, referring to FIG. 8(b), it may be identified that the sanded metal frame has partially protruding irregularities and a flat surface both.

According to an embodiment, referring to FIG. 8(c), it may be identified that the metal frame according to the disclosure has uniform, high-density irregularities formed on the surface. Thus, it may be identified that a low-gloss, soft texture, and matte particle texturing feel are implemented on the surface of the metal frame according to the disclosure.

Figure 9:
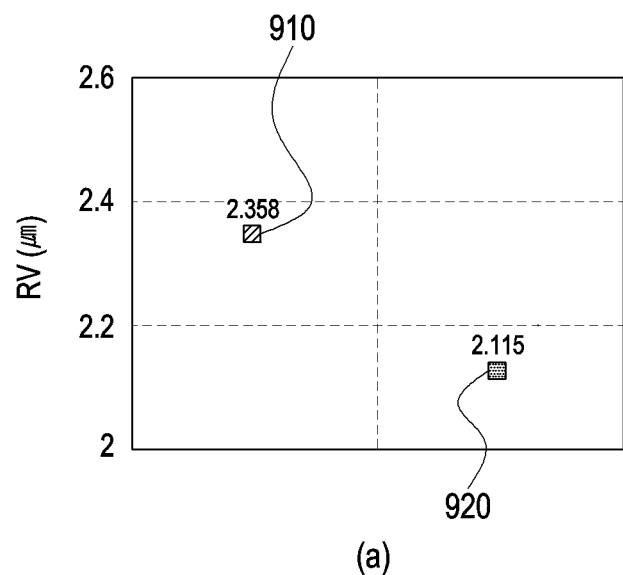
FIG. 9 is a view illustrating the height of irregularities and the depth of valleys of a metal frame according to a surface treatment scheme.
Figure 9:
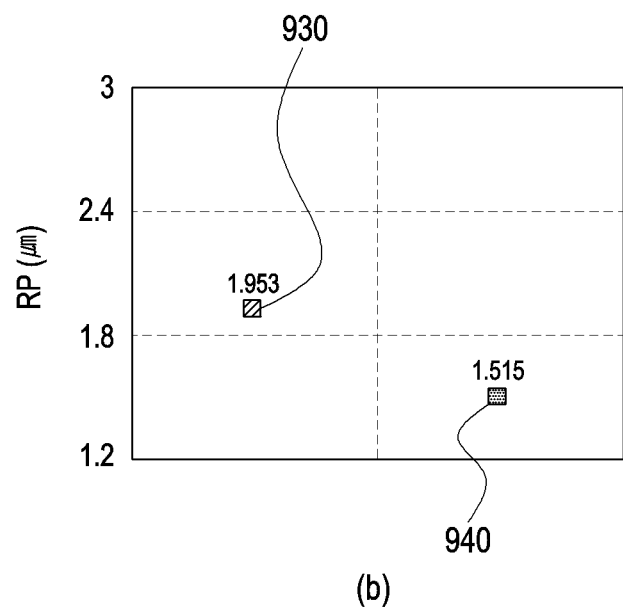

FIG. 9 is a view illustrating the height of irregularities and the depth of valleys of a metal frame according to a surface treatment scheme. For example, FIG. 9(a) may show the maximum height Rv of the irregularities, and FIG. 9(b) may show the maximum depth Rp of the valleys. According to an embodiment, the maximum height of the irregularities and the maximum depth of the valleys may mean the surface roughness of the metal.

According to a comparative example, referring to FIG. 9(a), it may be identified that the maximum height 910 of the irregularities on the sanded surface of the metal frame is 2.358 µm and that the maximum height 920 of the irregularities of the metal frame according to the disclosure is 2.115 µm.

According to a comparative example, referring to FIG. 9(b), it may be identified that the maximum depth of the valleys on the sanded surface of the metal frame is 1.953 µm and that the maximum depth 940 of the valleys of the metal frame according to the disclosure is 1.515 µm.

As such, referring to FIGS. 9(a) and (b), it may be identified that, as compared with the surface roughness of the sanded metal frame according to the comparative example, the surface of the metal frame according to the disclosure is formed with relatively gentle roughness and has soft texture.

Thus, according to the disclosure, it is possible to form soft irregularities on the surface of the metal frame and thus implement a new texture, as that of a microfiber cloth.

Figure 10:
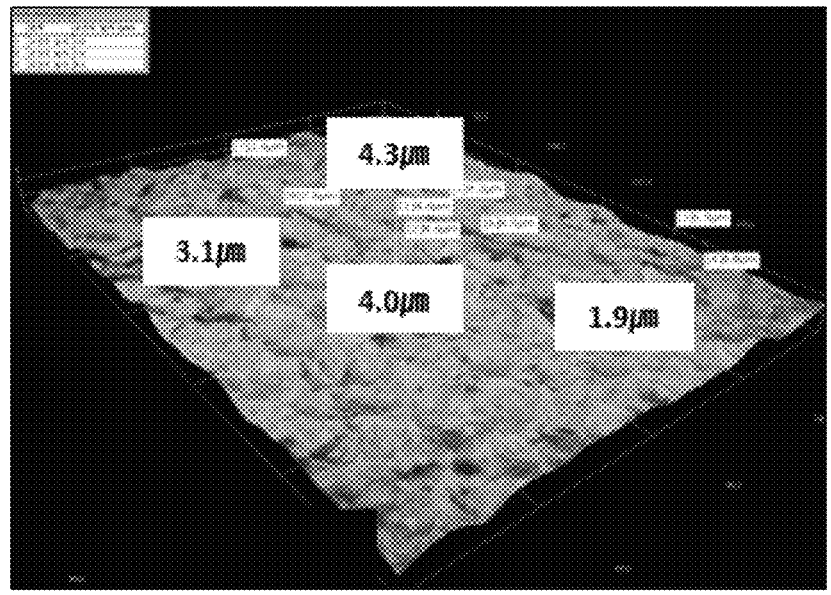
FIG. 10 is a view illustrating a difference in the height of the surface of a metal frame according to a surface treatment scheme.
Figure 10:
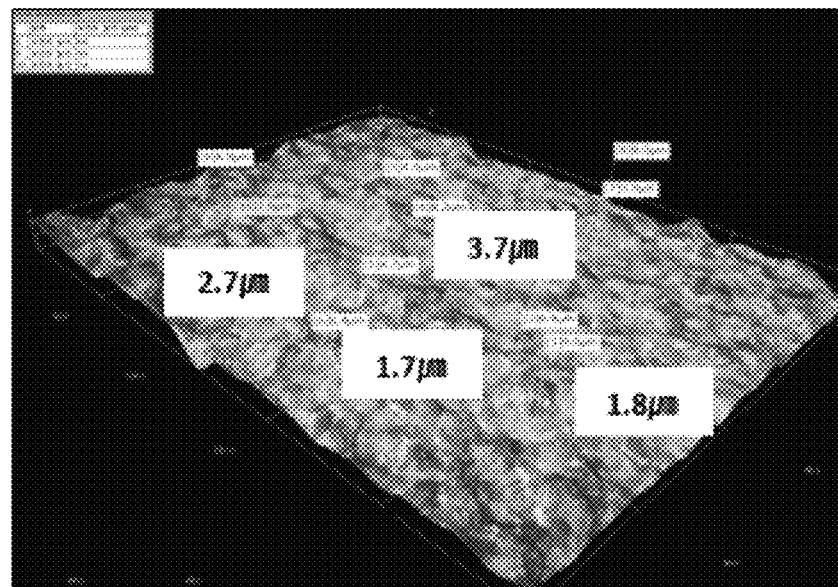

FIG. 10 is a view illustrating a difference in the height of the surface of a metal frame according to a surface treatment scheme. For example, FIG. 10(a) shows differences in the height of the irregularities on the sanded surface of the metal frame according to a comparative example, and FIG. 10(b) shows differences in the height of the irregularities on the surface of the metal frame according to the disclosure.

According to a comparative example, referring to FIG. 10(a), it may be identified that the differences in the height of the irregularities on the sanded surface of the metal frame are 4.3 µm, 4.0 µm, and 1.9 µm, with an average height difference of 3.1 µm, and referring to FIG. 10(b), it may be identified that the differences in the height of the irregularities on the surface of the metal frame according to the disclosure are 3.7 µm, 2.7 µm, 1.7 µm, and 1.8 µm, with a low average height difference of 2.4 µm.

Thus, referring to the differences in the height of the irregularities on the surface of the metal frame according to the disclosure, it may be identified that the metal frame according to the disclosure has lower roughness than the conventional sanded metal frame and thus has soft texture.

Figure 11A:
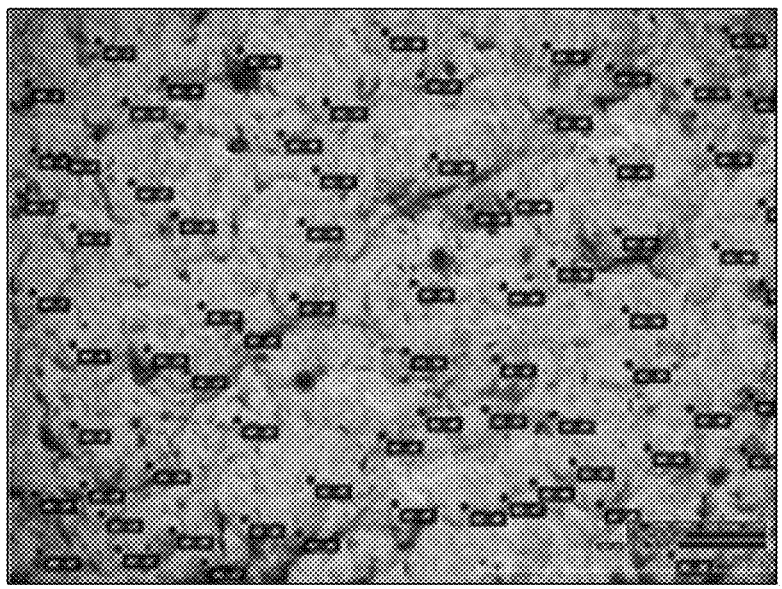
FIG. 11A is a view illustrating a particle distribution of the surface of a metal frame according to a surface treatment scheme.
Figure 11A:
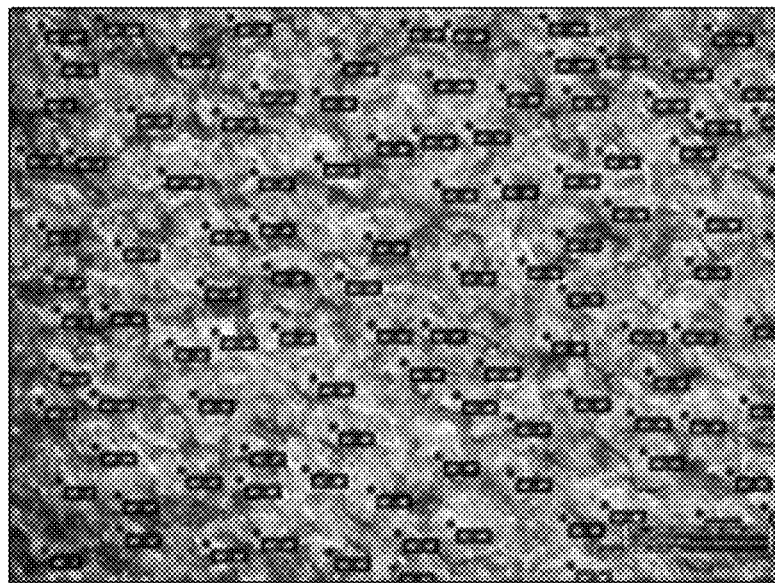

FIG. 11A is a view illustrating a particle distribution of the surface of a metal frame according to a surface treatment scheme. For example, FIG. 11A(a) shows the particle distribution on the sanded surface of the metal frame according to a comparative example, and FIG. 11A(b) shows the particle distribution on the surface of the metal frame according to the disclosure. For example, the particle distribution may refer to the distribution of irregularities.

According to a comparative example, referring to FIG. 11A(a), it may be identified that as the particles on the sanded surface of the metal frame are formed in uneven large sizes, the number of particles per unit area (1 cm²) is small, and the particle distribution is non-uniform.

According to an embodiment, referring to FIG. 11A(b), it may be identified that as the particles on the surface of the metal frame according to the disclosure are formed in even small sizes, the number of particles per unit area is large, and the particle distribution is uniform.

Figure 11B:
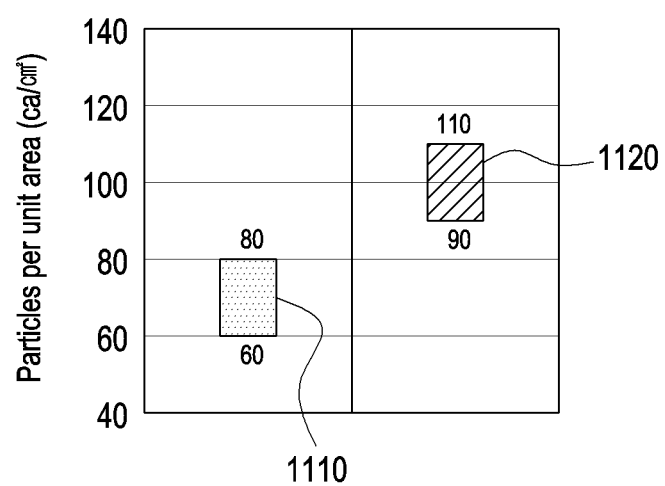
FIG. 11B is a view illustrating the number of particles per unit area of the surface of a metal frame according to a surface treatment scheme.

FIG. 11B is a view illustrating the number of particles per unit area of the surface of a metal frame according to a surface treatment scheme.

According to a comparative example, referring to FIG. 11B, it may be identified that the number 1110 of particles per unit area (1 cm²) of the sanded metal frame is 60 to 80, that is, 70 particles on average are distributed in the unit area.

According to an embodiment, it may be identified that the number 1120 of particles per unit area of the metal frame according to the disclosure is 90 to 110, that is, 100 particles on average are distributed in the unit area.

Thus, it may be identified that the metal frame according to the disclosure has multiple particles uniformly distributed in the same area as compared with the conventional sanded metal frame. Therefore, it is possible to implement a metal frame with soft texture according to the disclosure.

Figure 12:
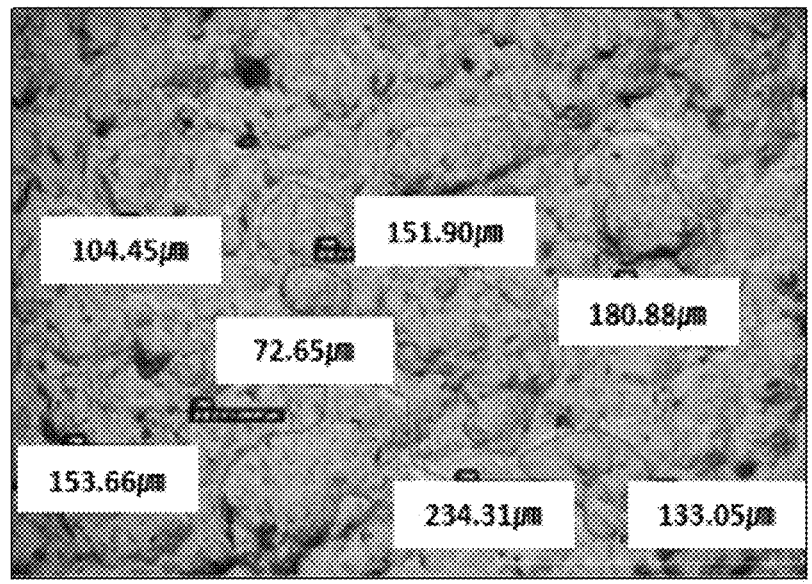
FIG. 12 is a view illustrating the particle size of the surface of a metal frame according to a surface treatment scheme.
Figure 12:
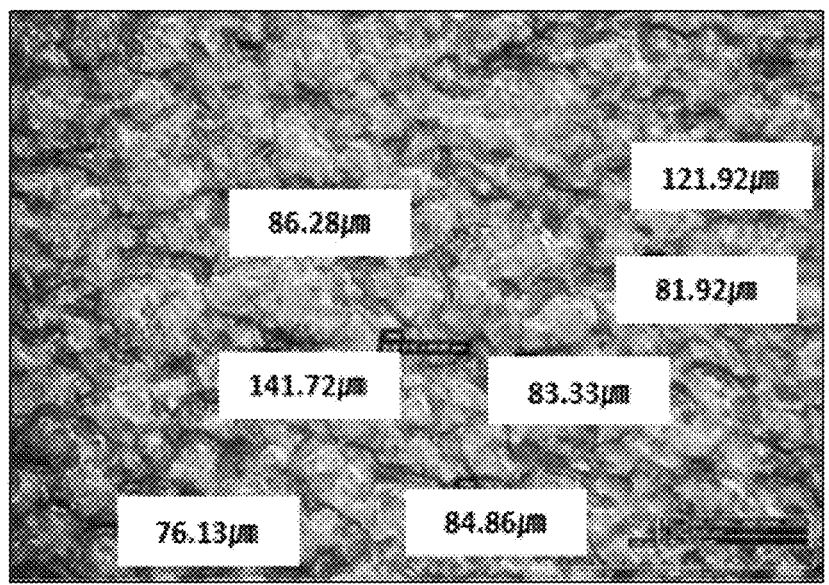

FIG. 12 is a view illustrating the particle size of the surface of a metal frame according to a surface treatment scheme. For example, FIG. 12(a) shows the particle size on the sanded surface of the metal frame according to a comparative example, and FIG. 12(b) shows the particle size on the surface of the metal frame according to the disclosure.

According to a comparative example, referring to FIG. 12(a), it may be identified that the particle size on the sanded surface of the metal frame is 73 μm to 234 μm, that is, large particles and small particles within such a size range are distributed.

According to an embodiment, referring to FIG. 12(b), it may be identified that the particle size on the surface of the metal frame according to the disclosure is 76 μm to 142 μm, that is, particles in such a size range are distributed, so that the metal frame according to the disclosure has a uniform particle texturing feel.

As such, since small, uniform particles are distributed in the same area on the surface of the metal frame according to the disclosure, it is possible to provide a matte particle texturing feel.

Figure 13:
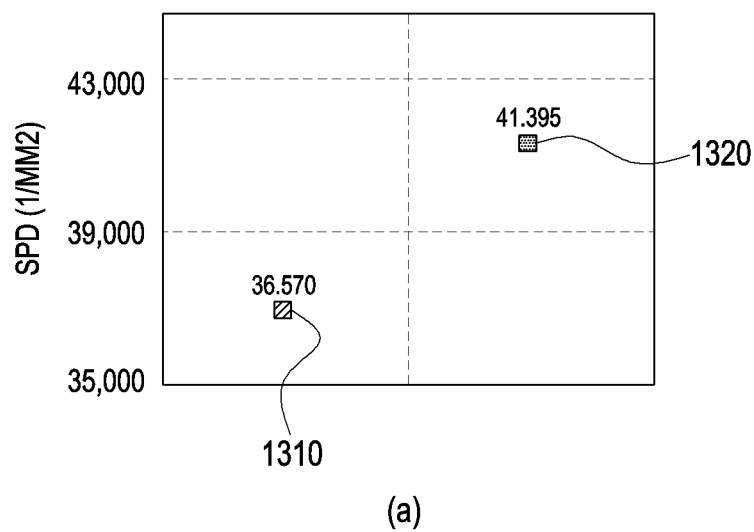
FIG. 13 is a view illustrating the root mean square of gradients present on the surface and the density of the peak of the surface of a metal frame according to a surface treatment scheme.
Figure 13:
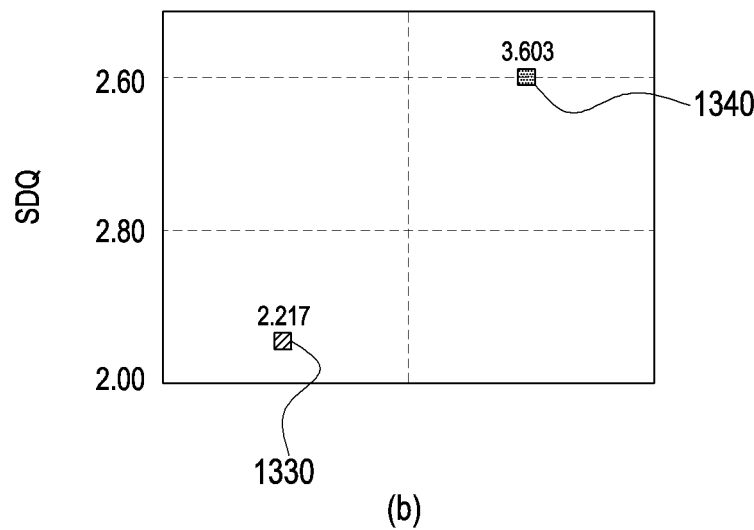

FIG. 13 is a view illustrating the root mean square for the gradients present on the surface and the density of the peak of the surface of a metal frame according to a surface treatment scheme. For example, FIG. 13(a) shows the density of peaks on the surface of the metal frame according to the surface treatment scheme, and FIG. 13(b) shows the root mean square for the gradients present on the surface of the metal frame according to the surface treatment scheme. For example, peak may mean a fine irregularity included in the irregularities on the surface of the metal frame. According to an embodiment, the density of peaks (SPD) may mean the number of peaks per unit area (1 mm²).

According to an embodiment, the root mean square for gradients (root mean square gradient square average of differential data (SPQ)) is the square root of the mean of the squares of the gradients included in the unit area (1 mm²). If flat, the SPQ is 0, and as the SPQ increases, the number of gradients or irregularities in the unit area increases.

According to an embodiment, the density of peaks and the root mean square gradient may represent how matte the surface of the metal frame is.

According to an embodiment, referring to FIG. 13(a), it may be identified that the density 1310 of peaks per unit area (1 mm²) of the sanded metal frame according to a comparative example is 36,570, and the density 1320 of peaks per unit area of the metal frame according to the disclosure is 41,395.

According to an embodiment, referring to FIG. 13(b), it may be identified that the root mean square gradient 1330 per unit area of the sanded metal frame according to a comparative example is 2,217, and the root mean square gradient 1340 per unit area of the metal frame according to the disclosure is 3,603.

Thus, it may be identified that the surface of the metal frame according to the disclosure has more peaks in the same area and a distribution of particles with high gradients and thus implements matte texture.

According to an embodiment, a method for manufacturing a housing (e.g., the housing 310 of FIG. 3) of an electronic device (e.g., the electronic device 101 of FIG. 1) may comprise: forming curves on a surface of a metal frame; and immersing the metal frame in an alkali etching solution including a phosphate.

According to an embodiment, a concentration of the phosphate may be 1% to 50% in the alkali etching solution.

According to an embodiment, a concentration of the phosphate may be 1% to 30% in the alkali etching solution.

According to an embodiment, the concentration of the alkali etching solution may be 1% to 50% in the alkali etching solution.

According to an embodiment, the alkali etching solution may include at least one of NaOH, KOH, or LiOH.

According to an embodiment, the phosphate in the alkali etching solution may include at least one of sodium tripolyphosphate, potassium triphosphate, sodium pyrophosphate, or potassium polyphosphate.

According to an embodiment, the immersing the metal frame in the alkali etching solution including the phosphate comprises immersing the metal frame at a temperature in a range between 30° C. (86° F.) to 80° C. (176° F.).

According to an embodiment, immersing the metal frame in the alkali etching solution including the phosphate comprises immersing the metal frame between 10 seconds and 20 minutes.

According to an embodiment, the surface of the immersed metal frame may have a gloss value of 1 gloss unit (Gu) to 10 Gu.

According to an embodiment, a maximum height of a plurality of irregularities disposed on the surface of the immersed metal frame may be in a range from 0.1 μm to 2.3 μm, and a maximum depth of valleys between the plurality of irregularities may be in a range from 0.1 μm to 1.8 μm.

According to an embodiment, the surface of the immersed metal frame may have 90 to 200 irregularities per unit area of 1 cm².

According to an embodiment, the surface of the immersed metal frame has 37000 to 50000 peaks per unit area of 1 mm². A root mean square gradient for the peaks may be 2500 to 4000.

According to an embodiment, the immersed metal frame may have a same texture on an outer and inner surface thereof. According to an embodiment, a housing of an electronic device may comprise a metal frame.

A surface of the metal frame may have a gloss value of 1 gloss unit (Gu) to 10 Gu, and a maximum height of a plurality of irregularities disposed on the surface may be in a range between 0.1 μm to 2.3 μm. A maximum depth of valleys between the plurality of irregularities may be in a range between 0.1 μm to 1.8 μm, and a number of the irregularities per unit area of 1 cm² may be in a range between 90 to 200.

According to an embodiment, the metal frame may comprise aluminum plate material comprising at least one of a 2xxx series alloy, a 6xxx series alloy, and a high strength 7xxx series alloy.

According to an embodiment, the metal frame may comprise an aluminum alloy, and the aluminum alloy may include aluminum, as its main component, and copper, magnesium, manganese, silicon, tin, or zinc, as a main alloying element.

According to an embodiment, the metal frame may comprise an electrical conductor.

According to an embodiment, the metal frame may be configured to radiate an electronic signal generated by the electronic device.

According to an embodiment, the surface of the metal frame has 37000 to 50000 peaks per unit area of 1 mm². A root mean square gradient for the peaks may be 2500 to 4000.

According to an embodiment, the metal frame may have a same texture on an outer and inner surface thereof.

According to an embodiment, the metal frame may be immersed in an alkaline etching solution including a phosphate.

According to an embodiment, a concentration of the phosphate may be 1% to 50%.

According to an embodiment, the alkali etching solution may include at least one of NaOH, KOH, or LiOH.

According to an embodiment, the phosphate may include at least one of sodium tripolyphosphate, potassium triphosphate, sodium pyrophosphate, or potassium polyphosphate.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although certain embodiments have been described with a degree of particularity, it shall be understood that the foregoing embodiments are not limiting, and may be subject to modification, revisions, addition of elements, and omission of elements, without departing from the spirit and scope of this disclosure.

What is claimed is:

1. A housing of an electronic device, comprising,
   a metal frame,
   wherein a surface of the metal frame has:
   a gloss value of 1 gloss unit (Gu) to 10 Gu, and
   a maximum height of a plurality of irregularities disposed on the surface in a range between 0.1 µm to 2.3 µm, and a maximum depth of valleys between the plurality of irregularities in a range between 0.1 µm to 1.8 µm, from an average height, and
   a number of the plurality of irregularities per unit area of 1 cm$^2$ in a range between 90 to 200, wherein the surface of the metal frame has: 37000 to 50000 peaks per unit area of 1mm$^2$ and wherein a root mean square gradient for the peaks is 2500 to 4000, and
   wherein the metal frame comprises particles having particles within the range of 76 um and 142 um.

2. The housing of claim 1, wherein the metal frame has a same texture on an outer and inner surface thereof.

3. The housing of claim 1, wherein the metal frame is immersed in an alkali etching solution including a phosphate.

4. The housing of claim 3, wherein a concentration of the phosphate is 1% to 50%.

5. The housing of claim 1, wherein the metal frame comprises aluminum plate material comprising at least one of a 2xxx series alloy, a 6xxx series alloy, and a high strength 7xxx series alloy.

6. The housing of claim 1, wherein the metal frame comprises an aluminum alloy, and the aluminum alloy includes aluminum, and copper, magnesium, manganese, silicon, tin, or zinc, as an alloying element.

* * * * *